United States Patent
Haartsen

(10) Patent No.: US 7,272,078 B1
(45) Date of Patent: Sep. 18, 2007

(54) EFFICIENT CLOCK CALIBRATION IN ELECTRONIC EQUIPMENT

(75) Inventor: Jacobus Cornelis Haartsen, Hardenberg (NL)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 11/548,784

(22) Filed: Oct. 12, 2006

(51) Int. Cl.
*G04F 5/00* (2006.01)
*G04F 8/00* (2006.01)
*G01R 23/14* (2006.01)

(52) U.S. Cl. .................. 368/118; 368/156; 324/76.41; 702/75

(58) Field of Classification Search .................. 368/10, 368/133, 118, 120, 155–156; 324/76.41, 324/76.42, 76.47; 702/75, 78, 79
See application file for complete search history.

(56) References Cited

U.S. PATENT DOCUMENTS

| | | | | |
|---|---|---|---|---|
| 5,424,664 A | * | 6/1995 | Phillips | 327/106 |
| 5,488,645 A | * | 1/1996 | Mori et al. | 377/20 |
| 5,663,970 A | * | 9/1997 | Bae | 714/814 |
| 6,016,312 A | * | 1/2000 | Storm et al. | 370/311 |
| 6,088,602 A | | 7/2000 | Banister | |
| 6,124,764 A | | 9/2000 | Haartsen et al. | |
| 6,304,517 B1 | | 10/2001 | Ledfelt et al. | |
| 6,889,055 B1 | | 5/2005 | Neufeld | |
| 2003/0095008 A1 | | 5/2003 | Kranz | |
| 2005/0241362 A1 | | 11/2005 | Oberle et al. | |

FOREIGN PATENT DOCUMENTS

| | | |
|---|---|---|
| EP | 0 939 495 A | 9/1999 |
| EP | 1 503 506 A1 | 12/2000 |
| EP | 1 551 102 A1 | 12/2003 |
| EP | 1 585 223 A | 10/2005 |
| GB | 2 397 465 A | 7/2004 |
| JP | 05-067967 | 3/1993 |

OTHER PUBLICATIONS

European Standard Search Report, dated May 15, 2007, in connection with U.S. Appl. No. 11/548,784.

* cited by examiner

*Primary Examiner*—Vit W. Miska
(74) *Attorney, Agent, or Firm*—Potomac Patent Group PLLC

(57) ABSTRACT

A representative measurement indicating a relative oscillation speed of a reference clock during a representative calibration period is ascertained. Multiple calibration periods are defined including first and second calibration periods. The first calibration period begins at a first start time, wherein a first time offset value is equal to a difference between the first start time and a transition point of the reference clock signal within the first calibration period. The second calibration period begins at a second start time, wherein a second time offset value is equal to a difference between the second start time and a transition point of the reference clock signal within the second calibration period. The first and second time offset values are different from one another. Measurements are generated by, for each one of the calibration periods, measuring the speed of the reference clock. The measurements are then averaged.

27 Claims, 10 Drawing Sheets

EFFICIENT CLOCK CALIBRATION IN ELECTRONIC EQUIPMENT

BACKGROUND

The present invention relates to clock calibration in electronic equipment, and more particularly to clock calibration in communication equipment.

There is a wide variety of digital communication systems, some presently in existence, and some still under development. Digital communication systems include time-division multiple access (TDMA) systems, such as cellular radio telephone systems that comply with the Global System for Mobile communications (GSM) telecommunication standard and its enhancements like GSM/EDGE, and Code-Division Multiple Access (CDMA) systems, such as cellular radio telephone systems that comply with the IS-95, cdma2000, and Wideband CDMA (WCDMA) telecommunication standards. Digital communication systems also include "blended" TDMA and CDMA systems, such as cellular radio telephone systems that comply with the Universal Mobile Telecommunications System (UMTS) standard, which specifies a third generation (3G) mobile system being developed by the European Telecommunications Standards Institute (ETSI) within the International Telecommunication Union's (ITU's) IMT-2000 framework. The Third Generation Partnership Project (3GPP) promulgates the UMTS standard. High Speed Downlink Packet-data Access (HSDPA) is an evolution of WCDMA specified in the Release 5 version of the 3GPP WCDMA specification. The 3GPP has begun considering the next major step or evolution of the 3G standard (sometimes called Super 3G—"S3G") to ensure the long-term competitiveness of 3G.

Other types of digital communication systems allow equipment to collaborate with one another by means of wireless networks. Examples include Wireless Local Area Network (WLAN) and Bluetooth® equipment.

One thing that these different systems have in common is the need to maintain accurate timing. In modern radio transceivers (e.g., WCDMA, GSM and S3G phones and WLAN and Bluetooth® equipment), two different clocks are used: a system clock (SC) and a real-time clock (RTC). The SC is usually a high frequency clock, running at several MHz, and generated by a highly stable oscillator, often applying a temperature-controlled crystal. The SC acts as the reference and is the frequency source for all radio related operations, such as radio frequency (RF) carrier synthesis. The crystals used for the SC have an accuracy on the order of 20 parts per million (ppm). However, for cellular terminals, this accuracy is improved by locking the SC to the downlink signals transmitted by the mobile network base stations. The SC is tuned to the downlink signals and therefore inherits the better stability of the clock reference used in the base station, which is about 0.5 ppm.

The SC's stability is obtained at the expense of electrical current consumption. To run the SC, several tens of milli-Amperes (mA) are required. In particular, the SC requires too much current when the transceiver is in idle mode or in a low-power mode in which it sleeps most of the time. Therefore, the SC is turned off during the sleep states. In order to preserve timing during such sleep states, each modern transceiver also includes a non-reference clock, such as a low-power oscillator (LPO) or real-time clock (RTC) which runs at a much lower level of current consumption (several tens to hundreds of micro Amperes). The RTC usually runs at a much lower frequency than the SC, typically several kHz.

The RTC is used for several timing operations in the cellular terminal. It controls the sleep periods, and determines such things as when the terminal has to wake up to monitor the paging control channel or scan other broadcast control channels. The RTC also determines for how long uplink synchronization with the network can be maintained. Uplink synchronization is critical in time slotted systems, (i.e., systems that have a TDMA component, such as GSM and the newly developed Long Term Evolution (LTE) for 3G systems (S3G)). Due to the unknown round-trip propagation delay between the terminal and the base station, timing advance (TA) control messages need to be sent to the terminal in order to align the receive timing of its uplink transmissions with the timing of other uplink transmissions. Clock drift is a general cause for uplink timing mismatch, and requires the terminal to send uplink bursts frequently so that the base station can measure the timing misalignment and suitably command the terminal to adjust its timing by way of the TA message.

The inherent stability of the RTC is very poor, typically from 50 to 100 ppm. However, its stability is improved by repeated calibrations. The SC is used as a stable reference during the calibration. Once the RTC is calibrated, it has a level of stability close to the stability of the SC. In between calibration events, the stability remains within a few ppm.

U.S. Pat. No. 6,124,764 describes a calibration method that exploits the periodic paging wake-up times. In particular, the LPO output signal is monitored during a number of monitoring windows M. These windows preferably correspond to the wake-up periods in the standby mode of the host system that the LPO is part of. During wake-up periods, other activities such as page scanning, for example, may take place. The results of the monitoring process are accumulated. Based on the accumulated result derived from M monitoring windows, a decision for the correction scheme is determined for the next period encompassing another M monitoring windows.

Conventional calibration techniques have a problem in that they require quite a long calibration time. During the calibration, the SC has to run and this causes a high level of current consumption to be experienced. In order to limit the power consumption, the calibration duty cycle is kept low. However, this means that there is quite a long time between consecutive calibration updates. During this time, the RTC may drift too far away. Since the RTC controls the uplink timing, this drift will require uplink bursts to be sent to the base station frequently to support the TA procedure. The terminal expends power when it sends an uplink burst, and this reduces the terminal standby time. Furthermore, all of these uplink bursts increase overhead in the network.

It is therefore desired to provide clock calibration techniques and apparatuses that overcome these problems.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in methods and apparatuses that ascertain a representative measurement that is indicative of a relative oscillation speed of a reference clock during a representative calibration period, wherein the reference clock generates a reference clock signal, and wherein a known number of cycles of a signal generated by a non-reference clock span the representative calibration period. Ascertaining the representative measurement that is indicative of the relative oscillation speed of the reference clock during the representative calibration period includes defining a plurality of calibration periods including a first calibration period and a second calibration period. The first calibration period is caused to begin at a first start time, wherein a first time offset value is equal to a difference between the first start time and a transition point of the reference clock signal within the first calibration period. Similarly, the second calibration period is caused to begin at a second start time, wherein a second time offset value is equal to a difference between the second start time and a transition point of the reference clock signal within the second calibration period. The first time offset value is different from the second time offset value.

A plurality of measurements is generated by, for each one of the plurality of calibration periods, ascertaining a characteristic that is indicative of the relative oscillation speed of the reference clock during said one of the plurality of calibration periods. The plurality of measurements is used to ascertain an average measurement value. The average measurement value is used as the representative measurement that is indicative of the relative oscillation speed of the reference clock during the representative calibration period.

In some embodiments, the characteristic that is indicative of the relative oscillation speed of the reference clock during said one of the plurality of calibration periods is a numeric value representing a number of cycles of the reference clock that occur during said one of the plurality of calibration periods. In other embodiments, the characteristic that is indicative of the relative oscillation speed of the reference clock during said one of the plurality of calibration periods is a numeric value representing a frequency of the reference clock signal during said one of the plurality of calibration periods. In still other embodiments, the characteristic that is indicative of the relative oscillation speed of the reference clock during said one of the plurality of calibration periods is a numeric value representing a period of the reference clock signal during said one of the plurality of calibration periods.

In some embodiments, the plurality of calibration periods are concatenated with one another.

In some embodiments, each of the first and second start times is determined randomly or pseudorandomly.

In some alternatives, the second start time occurs within the first calibration period. In some such embodiments, the first start time is coincident with one transition point of the signal generated by the non-reference clock; the second start time is coincident with a different transition point of the signal generated by the non-reference clock; and the one transition point and the different transition point of the signal generated by the non-reference clock are not coincident with one another.

In some embodiments, the processes/apparatuses described herein are advantageously performed/employed within a mobile device. In some of these embodiments, each of the first and second start times is caused to occur during a wake-up period of the mobile device.

In some embodiments, the representative measurement that is indicative of the relative oscillation speed of the reference clock during the representative calibration period is used to calibrate the non-reference clock.

BRIEF DESCRIPTION OF THE DRAWINGS

The objects and advantages of the invention will be understood by reading the following detailed description in conjunction with the drawings in which.

DETAILED DESCRIPTION

Figure 1:
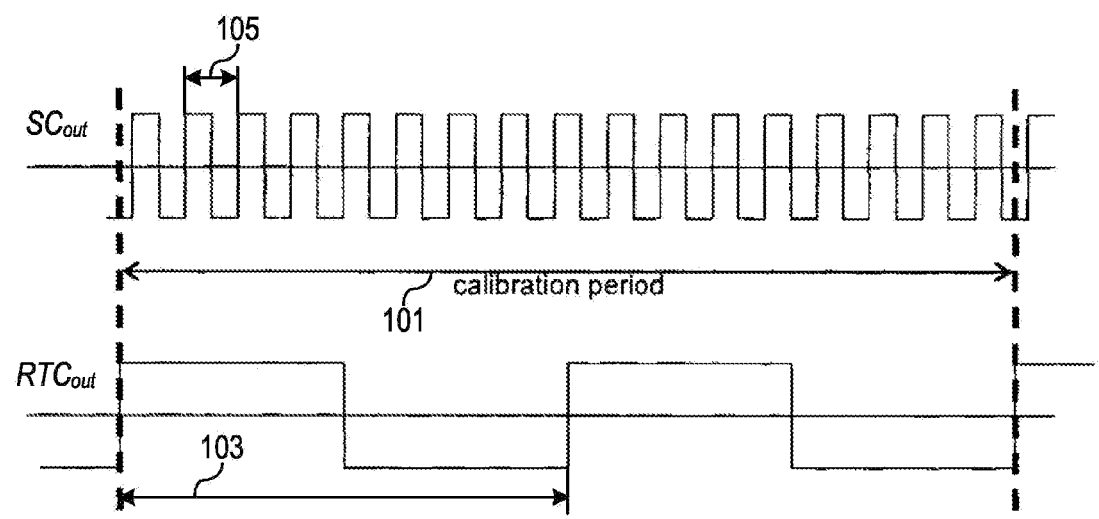
FIG. 1 depicts signals associated with a conventional calibration technique.

The various features of the invention will now be described with reference to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a computer system or other hardware capable of executing programmed instructions. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable carrier, such as solid-state memory, magnetic disk, optical disk or carrier wave (such as radio frequency, audio frequency or optical frequency carrier waves) containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments may be referred to herein as "logic configured to" perform a described action, or alternatively as "logic that" performs a described action.

In one aspect, a calibration method and apparatus are presented that make use of a number of counters counting in parallel over a short time period. The final calibration result is the combination of the results of the short counting periods. The start times of the counters are different for each counting period.

By applying a number of short counters in parallel, the same accuracy can be obtained in a shorter time period, thus reducing the calibration time. This in turn allows the calibration to be applied more often, resulting in a more accurate non-reference clock.

In other embodiments, hardware complexity is reduced while maintaining the same level of accuracy by employing the same counter(s) in each of a series of time intervals, and combining the results obtained therefrom.

These and other aspects are now described in greater detail.

FIG. 1 depicts signals associated with a conventional calibration technique involving a reference clock and a non-reference clock. More particularly, an exemplary output signal $SC_{OUT}$ generated by an SC (not shown) (or more generically, a reference clock) and an exemplary output signal $RTC_{OUT}$ generated by a RTC (not shown) (or more generically, a non-reference clock) are depicted. The start and stop times of a calibration period 101 are determined by the RTC. Thus, the number of RTC cycles 103 ($N_{RTC}$) spanning the calibration period 101 is already known. During the calibration period 101, the number of SC cycles 105 ($N_{SC}$) is counted. If the calibration period 101 spans $N_{RTC}$ cycles and $N_{SC}$ cycles are counted during the same period, the relationship between the RTC frequency, $F_{RTC}$, and the SC frequency, $F_{SC}$, is $$F_{RTC} = \frac{N_{RTC}}{N_{SC}} F_{SC}.$$

Figure 2:
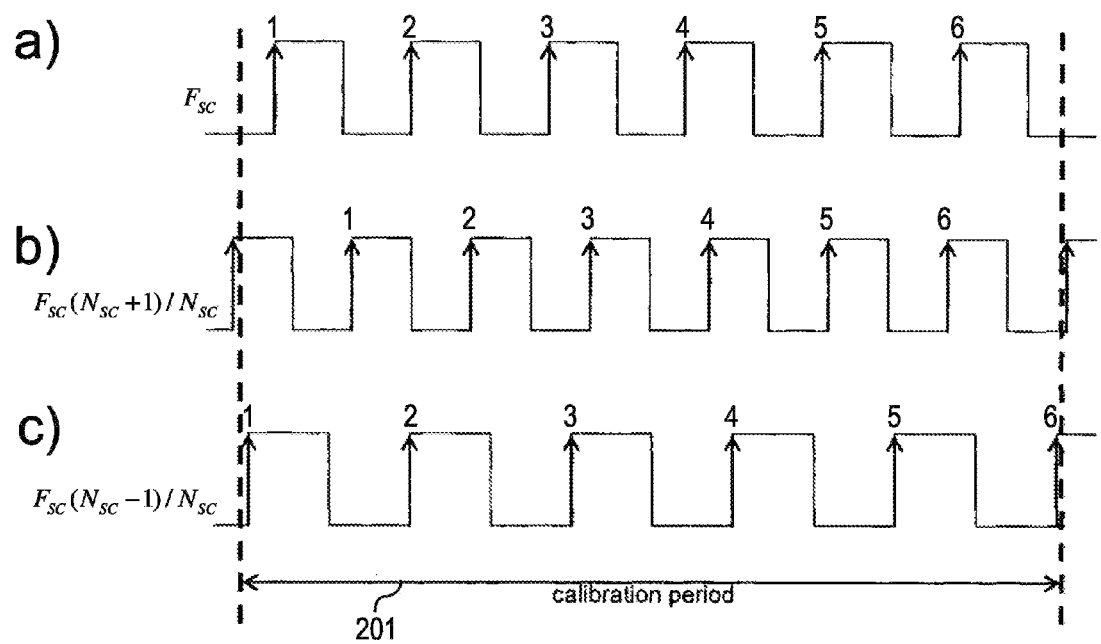
FIG. 2 is a diagram that illustrates how the timing of signals having different frequencies can each appear to have the same number of cycles during a given calibration period.

Since $F_{SC}$ is a highly stable frequency, the RTC frequency $F_{RTC}$ can be accurately determined. The timing circuit then takes into account the current value of $F_{RTC}$ when determining the timing of the sleep mode procedures. It can be shown that the final accuracy of this technique is $\pm 1/N_{SC}$. This is illustrated in FIG. 2, which is a diagram that illustrates how the timing of $SC_{OUT}$ signals having different frequencies can each appear to have the same number of cycles during a given calibration period 201. In example a), a nominal frequency, $F_{SC}$, of an $SC_{OUT}$ signal is measured by counting the number of leading edges of the signal to yield a count, $N_{SC}$. In this example, $N_{SC}=6$. However, the same number, $N_{SC}=6$, can be counted if $F_{SC}$ is increased by a factor of $(N_{SC}+1)/N_{SC}$, or decreased by a factor of $(N_{SC}-1)/N_{SC}$ as is shown in examples b) and c), respectively.

Figure 3:
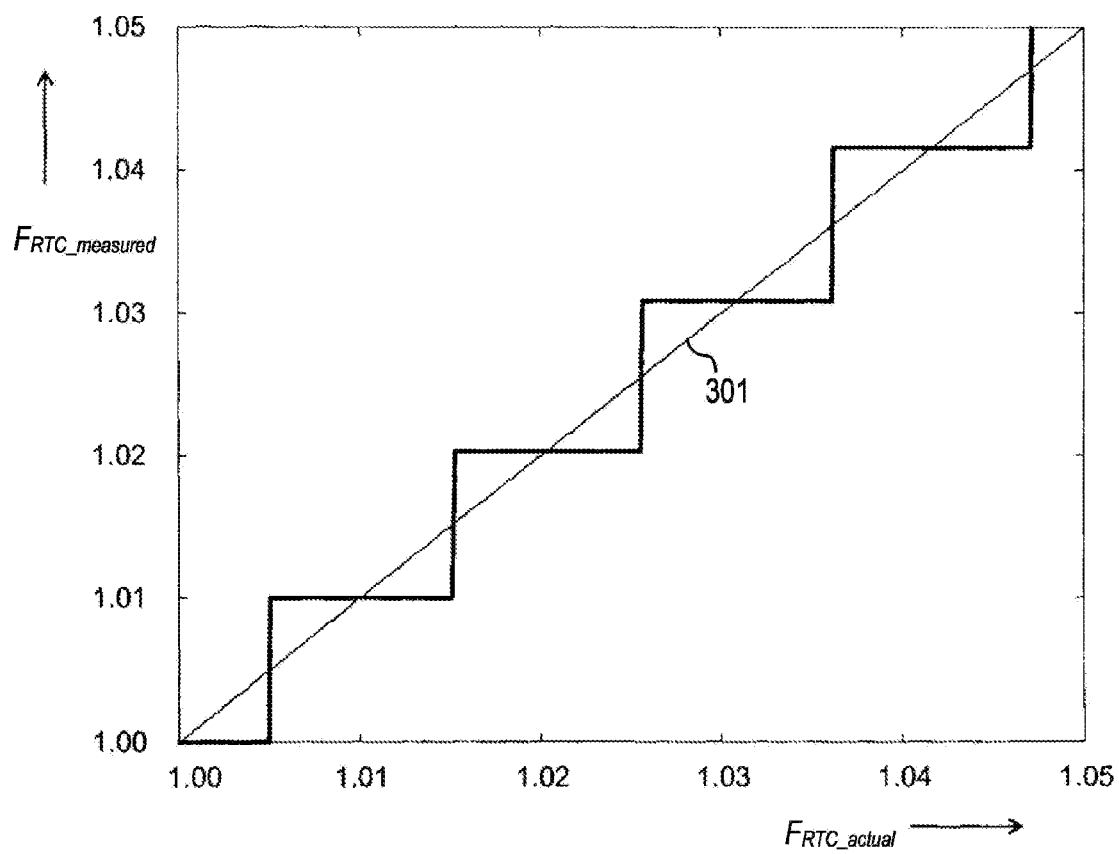
FIG. 3 is a graph depicting the input/output relationship of a conventional calibration method compared to an ideal input/output relationship.
Figure 4:
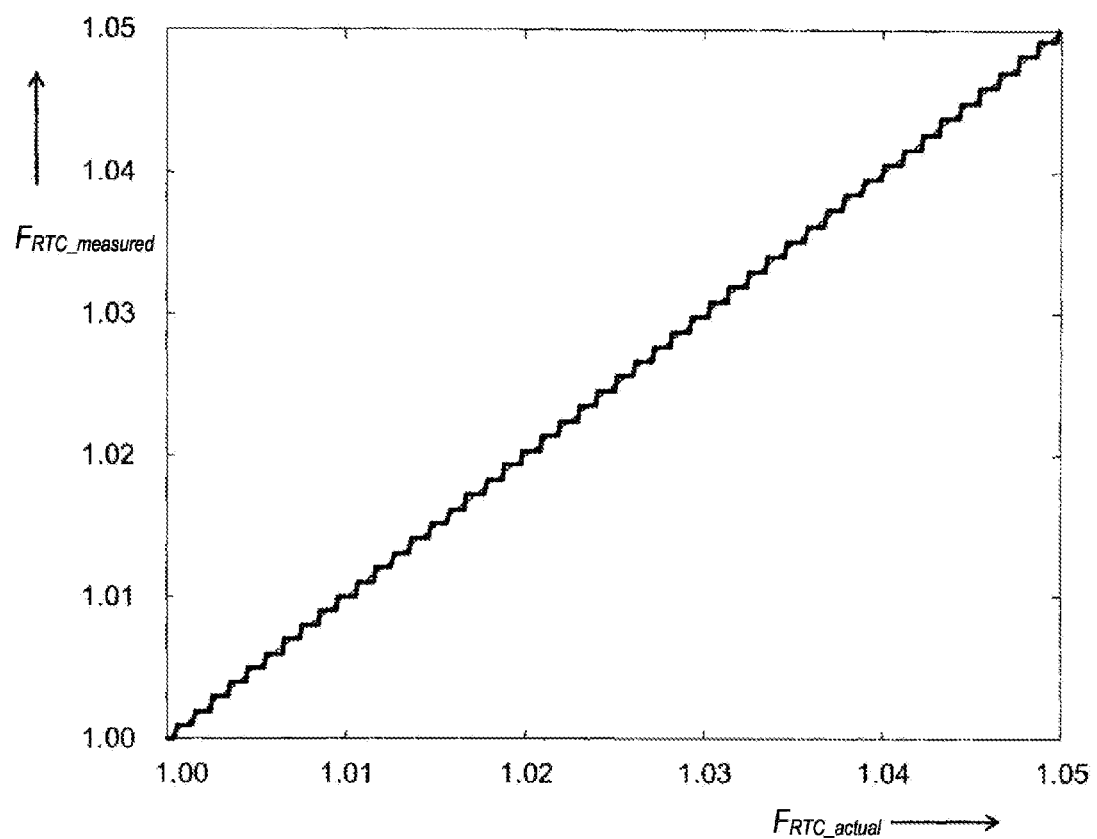
FIG. 4 is a graph illustrating the improved accuracy that is obtainable when measuring the frequency of a real time clock by increasing the calibration time.

This is also apparent from FIG. 3, which is a graph depicting the input/output relationship of a conventional calibration method compared to an ideal input/output relationship. In this example, $N_{SC}=100$, $N_{RTC}=1$, and $F_{SC}=100$. The actual value of $F_{RTC}$, shown on the horizontal axis, is increased from 1 to 1.05. The measured value of $F_{RTC}$ is shown on the vertical axis. The ideal relationship between actual and measured is depicted as the line 301. However, the measured values of $F_{RTC}$ (seen on the Y-axis) can only attain discrete values, so an inherent error is introduced (in this example, the inherent error is $\pm 0.005$). If the calibration time were to be increased by a factor of 10 (in this example, $N_{RTC}=10$, $N_{SC}=1000$), the quantization error would be reduced and the accuracy would therefore be improved by a factor of 10 as is shown in FIG. 4.

In conventional techniques, the number of cycles of the $SC_{OUT}$ signal is counted in a counter that has to have a size of at least $N_{SC}$. To be able to reach an accuracy of $\pm 1/N_{SC}$, the counter has to count for a time duration of $N_{SC}/F_{SC}$. If an accuracy of 0.1 ppm is desired and the SC frequency is 10 MHz, then the calibration duration using the conventional technique would have to be 1 second long. During this second, the SC has to run continuously. To keep the current consumption low, the calibration could only be carried out every few minutes. The accuracy of 0.1 ppm would require a counter capable of counting up to 10 million, which is represented by 24 bits.

In the following, calibration methods and apparatuses are described that yield improved accuracy without using a larger counter as just discussed above. In some embodiments, this is achieved by applying the same counter multiple times. Two of these embodiments will be described. In a first embodiment, a single short counter is used, which results in a reduction of hardware complexity but not in reduced calibration time. In a second embodiment, several short calibration periods are distributed in time.

Figure 5:
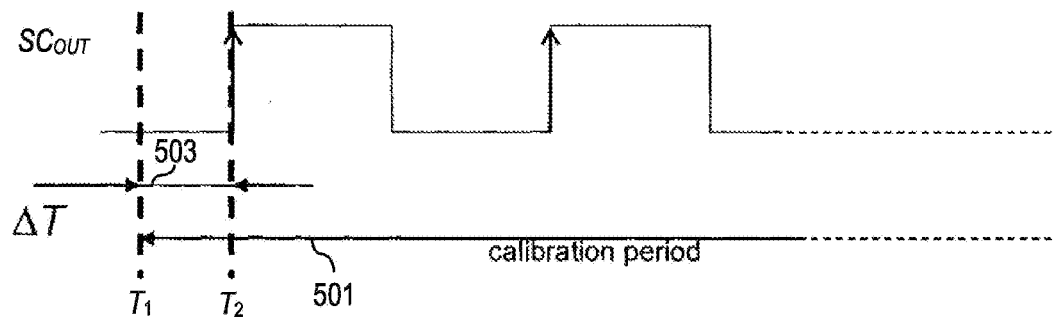
FIG. 5 depicts an exemplary SC output signal and an initial portion of a calibration period.

First, it is important to understand how the initial timing of the calibration period with respect to the reference (SC) cycle influences the measurement result. Each calibration period has a start time (i.e., a moment at which measurement begins), and each reference (SC) output signal has at least one transition point (e.g., the occurrence of a leading edge, trailing edge, zero or other level crossing) the detection of which is an indicator of the occurrence of a cycle of the SC output signal. The start time of the calibration period is related to a transition point of the non-reference signal. The first transition point of the reference output signal to occur after the start time is the first detected event to be counted (e.g., representative of a cycle) within the calibration period. FIG. 5, which depicts an exemplary SC output signal, $SC_{OUT}$, and an initial portion of a calibration period 501, will help illustrate this. The initial offset value 503, or misalignment $\Delta T$, between the start time $T_1$ of the calibration period and the next-occurring transition point $T_1$ (in this example, the next-occurring rising edge) of the SC output signal, $SC_{OUT}$, is also shown.

Figure 6:
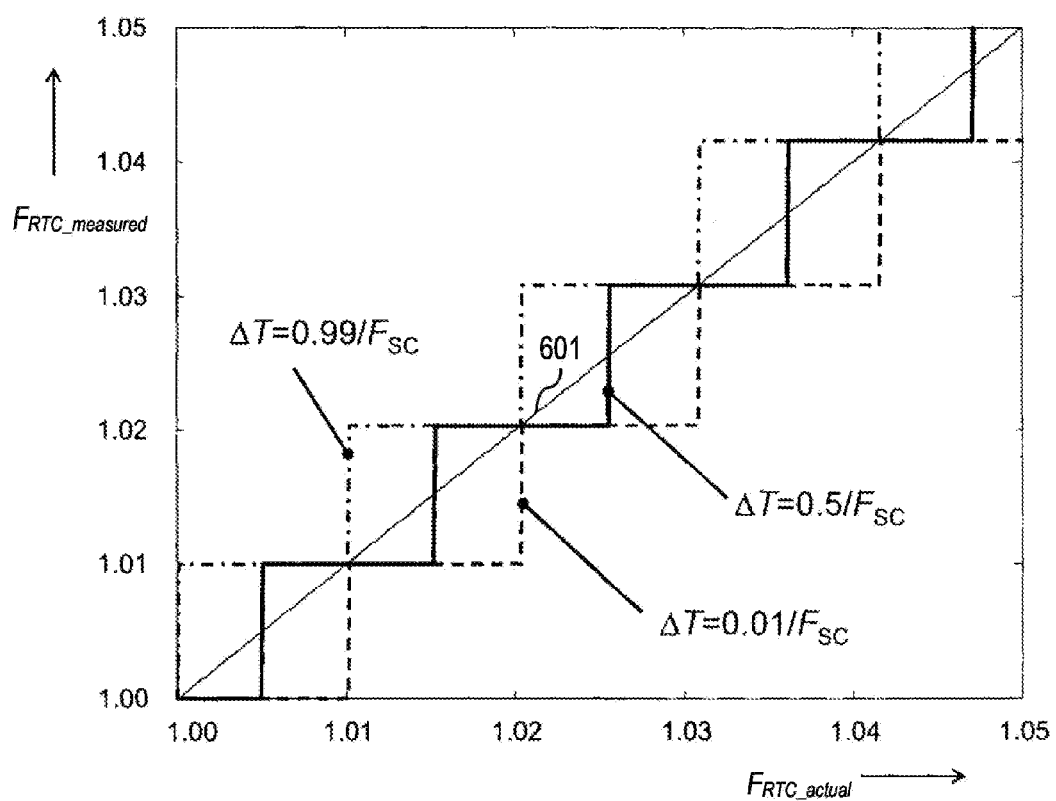
FIG. 6 depicts graphs illustrating the relationship between actual and measured frequency values of the RTC for three different initial offset values.
Figure 7:
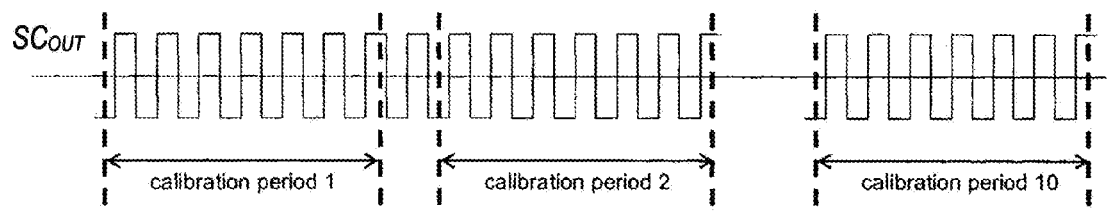
FIG. 7 is a timing diagram illustrating how repeated calibration operations are applied to an $SC_{OUT}$ signal.

To illustrate how, for a given value of $N_{SC}$, the initial offset value 503 influences the measurement result, the relationship between actual and measured frequency values of the RTC ($F_{RTC\_actual}$ and $F_{RTC\_measured}$, respectively) is depicted in FIG. 6 for three different initial offset values 503. The ideal relationship is shown as the straight line 601. For any given value of $F_{RTC\_actual}$, the error is seen as the difference between the measured frequency value ($F_{RTC\_measured}$) and the ideal value. It can be seen that the smallest error, equal to $\pm 0.5/N_{SC}$, is achieved only when $\Delta T=0.5/F_{SC}$. By contrast, for $\Delta T=0.99/F_{SC}$, the error can amount to $+1/N_{SC}$; and for $\Delta T=0.01/F_{SC}$, the error can amount to $-1/N_{SC}$. In accordance with one aspect of the invention, the accuracy of the calibration is increased by applying repeated calibration operations to an $SC_{OUT}$ signal, as shown in FIG. 7. The number of SC cycles in each calibration window is counted, and the mean (average) of the results is generated. Suppose, for the sake of example, that the calibration is repeated ten times ($N_{CAL}=10$). In the example shown in FIG. 7, the initial phase ΔT is the same for each calibration window. As a result, the measured count value ($N_{SC}$) is the same for each calibration window, and the mean is consequently identical to each individual count value. Therefore, the accuracy is not increased and the same input-output relationship results as is shown in FIG. 3 are obtained, that is for $N_{SC}$=100.

Figure 8:
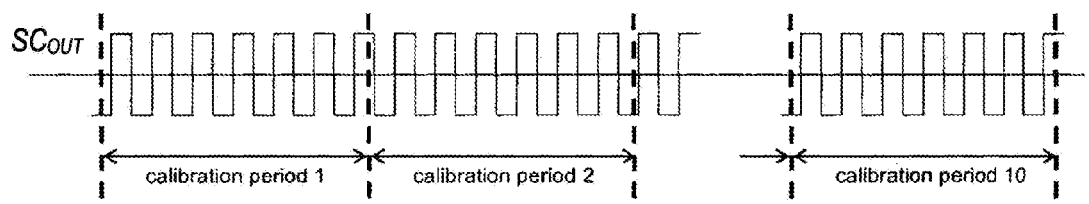
FIG. 8 is a timing diagram illustrating how repeated calibration operations are applied to an $SC_{OUT}$ signal, wherein the initial offset values are not kept constant.

To avoid this, in accordance with another aspect of the invention, repeated calibrations are performed as discussed above, but the initial offset value, ΔT, is not kept constant. One way of achieving this is by concatenating the calibration periods as is shown in FIG. 8. Due to the time sliding effects, the initial offset value, ΔT, is different for different calibration periods. Again, the final result is obtained by averaging the ten counts determined in the ten consecutive calibration periods. However, in this case the input-output relationship (i.e., between $F_{RTC\_actual}$ and $F_{RTC\_actual}$) is the same as that shown in FIG. 4. That is, the accuracy has indeed improved by a factor of 10 (and has the same accuracy as would be obtained with a single long counter, counting $N_{SC}$=1000). Concatenating the calibration periods has neither reduced nor increased the overall calibration time (which is still 1000/$F_{SC}$). However, the results have been obtained using a counter that is 10-times shorter than would be required by conventional techniques. Note that when $F_{SC}$ is an integer multiple of $F_{RTC}$, the initial offset does not change; but in that case, the measurement renders an exact value for $F_{RTC}$ and averaging is not necessary.

Figure 9:
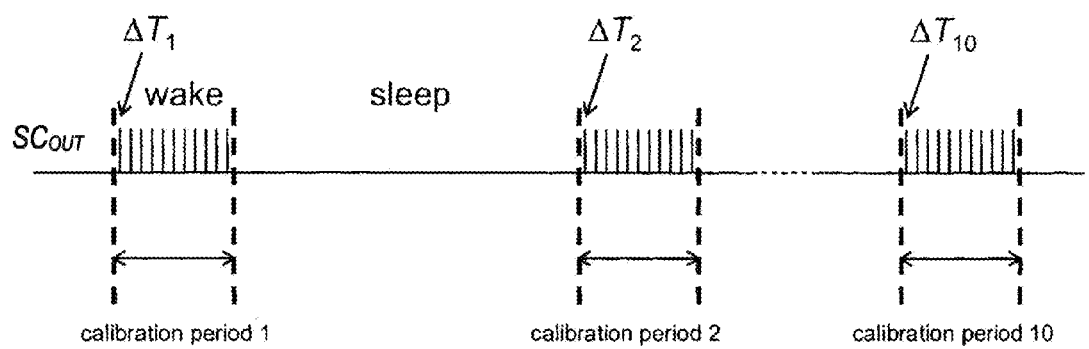
FIG. 9 is a timing diagram illustrating how repeated calibration operations are applied to an $SC_{OUT}$ signal during non-contiguous calibration periods, wherein the initial offset values are not kept constant.

It may not always be possible to concatenate the calibration periods as shown in FIG. 8. For example, as mentioned earlier U.S. Pat. No. 6,124,764 describes a calibration method that exploits the periodic paging wake-up times. The above described technique can now be applied wherein during each wake-up period, the number of SC cycles is counted. In order to benefit from repeated measurements, the initial offset value, ΔT, must be different for different measurement periods, and is preferably different for each new measurement period. One way of accomplishing this is by randomizing ΔT for each new wake-up time. The procedure is shown in the timing diagram of FIG. 9. The initial timing for each calibration period is chosen randomly or pseudo-randomly, preferably with a uniform distribution between [0,1/$F_{SC}$).

Figure 10:
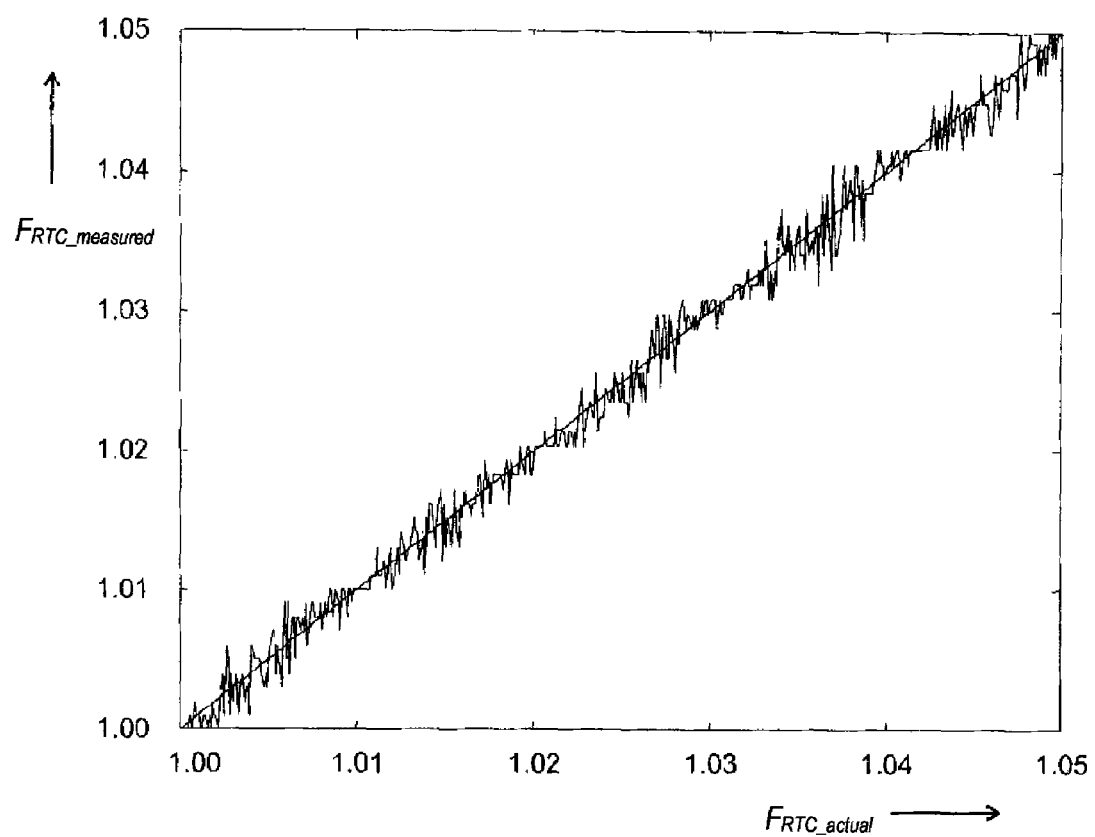
FIG. 10 depicts exemplary graphs illustrating the relationship between actual and measured frequency values of the RTC resulting from the use of non-contiguous calibration periods, wherein for each calibration period the initial offset value is determined randomly or pseudorandomly.

FIG. 10 shows an example of the resulting input-output relationship (i.e., $F_{RTC\_actual}$ on the horizontal axis and $F_{RTC\_measured}$ on the vertical axis) when averaging the counts obtained in the ten different wake-up periods. Although not improved by a factor of 10, the accuracy is clearly improved compared with the conventional technique of performing a single measurement (refer back to FIG. 3 for comparison).

Figure 11:
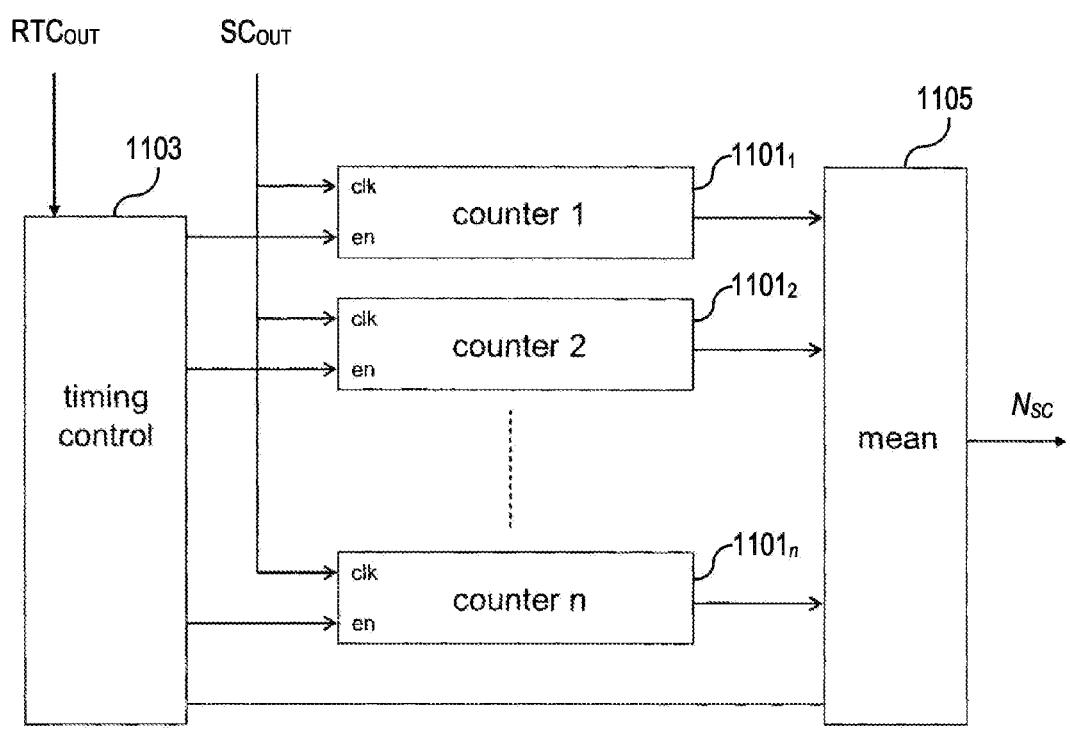
FIG. 11 is a block diagram of an embodiment that utilizes a plurality of counters whose operation overlaps one another.

Alternative embodiments that utilize a parallel approach will now be described. An exemplary embodiment is depicted in the block diagram of FIG. 11. The embodiment depicted in FIG. 11 can be included in any electronic equipment (not shown herein for purposes of clarity) requiring the type of calibration discussed herein including, but not limited to, cellular communication equipment (e.g., mobile devices), wireless local area network equipment, and wireless personal area network equipment. The embodiment includes a plurality (i.e., an integer number, n) of counters $1101_x$ (1≦x≦n). For example, an embodiment can include n=10 counters. Each of the counters $1101_x$ is capable of counting a nominal number of SC duty cycles ($N_{SC\_nom}$), for example $N_{SC\_nom}$=100. The SC output signal ($SC_{OUT}$) (or more generically, the output signal of a reference clock) is supplied to a clock input node of each of the counters $1101x$ for this purpose. Each of the counters $1101x$ responds to a transition point (e.g., an edge) of the SC output signal ($SC_{OUT}$) by adjusting (e.g., incrementing) the count value that it maintains. It will be noted that in alternative embodiments, it may be the case that earlier-started ones of the counters $1101_x$ could finish their measurement before other ones of the counters $1101_x$ are finished. In such cases, it may be possible to design the embodiment in such a way that the final counter value is stored in a memory, and that the counter $1101_x$ is restarted to obtain a measurement value of a later-occurring calibration period. Thus, the number of counters $1101_x$ (i.e., the value of n) need not be equal to the number of calibration periods to be measured.

The starting and stopping of each counter $1101_x$ is controlled by a corresponding one of n control signals (counter enable signals) generated by timing control logic 1103 and supplied to an enable input of a corresponding one of the counters $1011_x$. Each control signal (counter enable signal) is asserted for a duration equal to a duration of the representative calibration period, and each of the counters $1101_x$ is responsive to a transition point of the SC out signal only when its control signal (counter enable signal) is asserted. The count generated by each of the counters $1101_x$ represents the results of a corresponding one of n calibration periods that overlap each other to some extent. In this example, there will be 10 overlapping calibration periods because there are 10 counters.

Each of the counters $1101_x$ supplies its output to averaging logic 1105. The averaging logic 1105 receives the count values from the plurality of counters $1101_x$ and generates therefrom a mean (average) value, and supplies this at its output. This output value, which represents $N_{SC}$, can then be used to determine $F_{RTC}$ according to the relationship described earlier.

As discussed earlier, the output of the RTC ($RTC_{OUT}$) (or more generically, the signal generated by a non-reference clock) determines when calibration will be performed (e.g., calibration start and stop times based upon the occurrence of transition points of the non-reference clock). Again, in order to benefit from averaging the results, the initial offset values for the different counters must not all be the same, and are preferably all different. This can be achieved by including, within the timing control logic 1103, logic that randomizes the start time of each counter $1101_x$ (e.g., by means of random or pseudorandom techniques). This randomization of start times will result in an input-output relationship such as was shown in FIG. 10.

Figure 12:
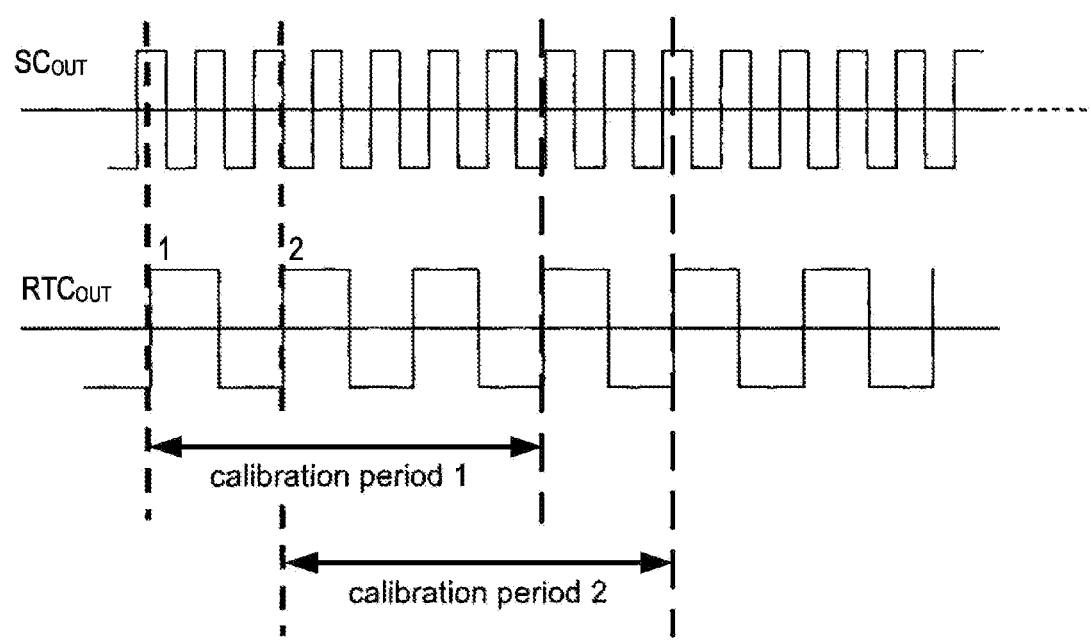
FIG. 12 is a timing diagram illustrating how the start and stop times of the plurality of counters are determined.

An alternative embodiment does not use randomized counter start times, but instead has the timing control logic 1103 including logic for determining counter start and stop times in accordance with the timing diagram of FIG. 12. FIG. 12 depicts an exemplary relationship between the signals $SC_{OUT}$ and $RTC_{OUT}$. The logic for determining counter start and stop times starts each of the counters $1101_x$ in succession, with the start of each counter $1101_x$ being delayed by one RTC cycle, so that the start of the nth counter $1101_n$ is delayed by n−1 RTC cycles from the start of the $1^{st}$ counter $1101_1$. (To get a perspective on how many RTC cycles this represents compared to the total number of RTC cycles during which the counters $1101_x$ will be operating, it will be noted that normally, the total calibration window counts many RTC cycles, e.g., on the order of $N_{RTC}$=32768 for a WCDMA implementation.) Due to the sliding effect, the initial offset values, ΔT, will not all be the same (i.e., at least two or more of the initial offset values will be different from one another). The consequent input-output relationship from following this approach will be like that depicted in FIG. 4. Thus, in this example the accuracy of calibration has been improved by a factor 10 while the calibration duration has increased by a negligible amount. In other words, the desired accuracy can be obtained in approximately 1/10 of the time.

Thus, regardless of which embodiment is implemented, the timing control logic 1103 causes, for example, a first counter enable signal to be asserted at a first start time, wherein a first time offset value is equal to a difference between the first start time and a first transition point of the reference clock signal; and causes a second counter enable signal to be asserted at a second start time, wherein a second time offset value is equal to a difference between the second start time and a second transition point of the reference clock signal. The timing control logic 1103 causes the first and second start times to be such that the first time offset value is different from the second time offset value.

Figure 13:
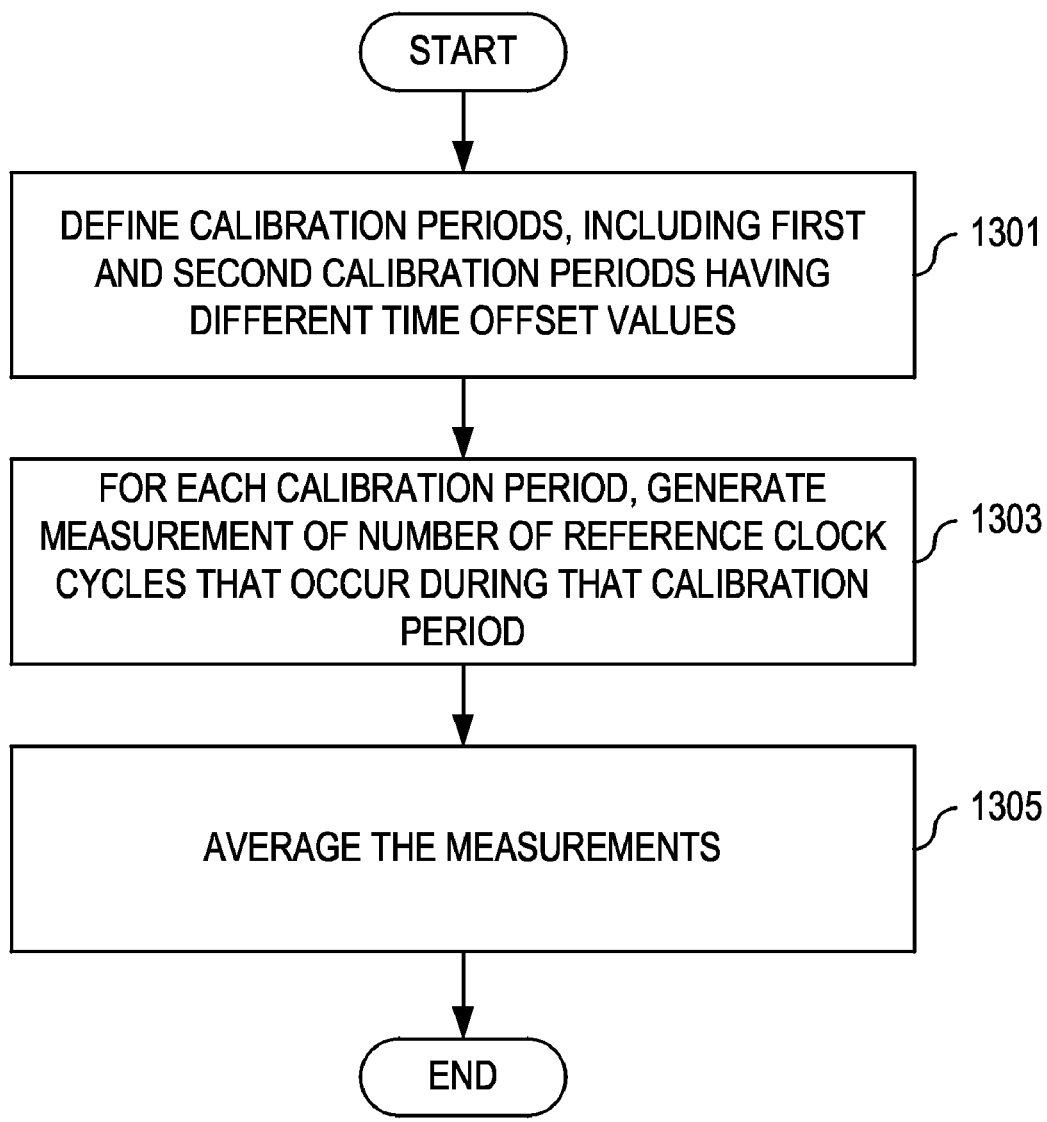
FIG. 13 is a flow chart depicting steps that are performed in accordance with various embodiments.

FIG. 13 is a flow chart depicting steps that are applicable to all of the above-described embodiments and others. The process begins by defining the calibration periods (step 1301), including first and second calibration periods, as discussed above. (Note: the use of "first" and "second" in this case does not refer to temporal order. Rather, these labels are used merely to distinguish one of the calibration periods from any other one of the calibration periods.) That is, each of the calibration periods has a start time related to a transition point of the non-reference clock. Each calibration period also has a time offset value that is equal to a difference between the start time of the calibration period and a transition point of the reference clock signal ($SC_{OUT}$) within the calibration period. In the exemplary embodiments described above, the time offset values are different for all of the calibration periods. However, this might not be the case for alternative embodiments. To obtain the benefits of the invention, the time offset values of at least two of the calibration periods (e.g., first and second time offset values corresponding to the first and second calibration periods, respectively) should be different from one another.

Next, a plurality of measurements are generated by, for each one of the plurality of calibration periods, measuring a number of cycles of the reference clock that occur during said one of the plurality of calibration periods (step 1303). In embodiments such as those depicted in FIGS. 8 and 9, these measurements are made one at a time, in sequence. Alternatively, in embodiments employing a plurality of counters (see, e.g., FIG. 11), two or more of the measurements may overlap each other.

The plurality of measurements thus obtained are then used to ascertain an average number of cycles of the reference clock signal per calibration period (step 1305).

This average number of cycles of the reference clock per calibration period is then used as the measured number cycles of the reference clock signal that occur during the calibration period. Such use could include, for example, determining the frequency of the non-reference clock ($RTC_{OUT}$) as discussed earlier. In some embodiments, such use might alternatively be a comparison of the measured value with a nominal value (e.g., for the purpose of determining whether the non-reference clock, $RTC_{OUT}$, is running too fast or too slow and by how much.)

The calibration techniques described above are advantageous in that they can, for example, be used either to improve the accuracy without increasing the hardware complexity using the serial approach, or to shorten the calibration time using the parallel approach. The latter is rather important, as it will improve the low power modes in cellular terminals; during each wake up period for checking the paging channel, the non-reference clock (e.g., RTC) can calibrated.

The invention has been described with reference to particular embodiments. However, it will be readily apparent to those skilled in the art that it is possible to embody the invention in specific forms other than those of the embodiment described above.

For example, the above-described embodiments involve ascertaining a numeric value that is representative of a number of cycles of the reference clock that occur during a calibration period. However, this is merely one possible characteristic that is indicative of the oscillation speed of the reference clock relative to that of the non-reference clock (henceforth, the "relative oscillation speed"). In other embodiments, other characteristics could be measured during the calibration periods, and these measured characteristics averaged. For example, the measured characteristic could be the frequency (e.g., expressed in Hz) of reference clock. In yet other embodiments, the measured characteristic could be the period (e.g., expressed in seconds).

Thus, the described embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of ascertaining a representative measurement that is indicative of a relative oscillation speed of a reference clock during a representative calibration period, wherein the reference clock generates a reference clock signal, and wherein a known number of cycles of a signal generated by a non-reference clock span the representative calibration period, the method comprising:
    defining a plurality of calibration periods including a first calibration period and a second calibration period;
    causing the first calibration period to begin at a first start time, wherein a first time offset value is equal to a difference between the first start time and a transition point of the reference clock signal within the first calibration period;
    causing the second calibration period to begin at a second start time, wherein a second time offset value is equal to a difference between the second start time and a transition point of the reference clock signal within the second calibration period, and wherein the first time offset value is different from the second time offset value;
    generating a plurality of measurements by, for each one of the plurality of calibration periods, ascertaining a characteristic that is indicative of the relative oscillation speed of the reference clock during said one of the plurality of calibration periods;
    using the plurality of measurements to ascertain an average measurement value; and
    using the average measurement value as the representative measurement that is indicative of the relative oscillation speed of the reference clock during the representative calibration period.

2. The method of claim 1, wherein the characteristic that is indicative of the relative oscillation speed of the reference clock during said one of the plurality of calibration periods is a numeric value representing a number of cycles of the reference clock that occur during said one of the plurality of calibration periods.

3. The method of claim 1, wherein the characteristic that is indicative of the relative oscillation speed of the reference clock during said one of the plurality of calibration periods is a numeric value representing a frequency of the reference clock signal during said one of the plurality of calibration periods.

4. The method of claim 1, wherein the characteristic that is indicative of the relative oscillation speed of the reference clock during said one of the plurality of calibration periods is a numeric value representing a period of the reference clock signal during said one of the plurality of calibration periods.

5. The method of claim 1, wherein the plurality of calibration periods are concatenated with one another.

6. The method of claim 1, wherein each of the first and second start times is determined randomly or pseudorandomly.

7. The method of claim 1, wherein the second start time occurs within the first calibration period.

8. The method of claim 7, wherein:
the first start time is coincident with one transition point of the signal generated by the non-reference clock;
the second start time is coincident with a different transition point of the signal generated by the non-reference clock; and
the one transition point and the different transition point of the signal generated by the non-reference clock are not coincident with one another.

9. The method of claim 1, wherein the method is carried out within a mobile device and each of the first and second start times occurs during a wake-up period of the mobile device.

10. The method of claim 1, comprising:
using the representative measurement that is indicative of the relative oscillation speed of the reference clock during the representative calibration period to calibrate the non-reference clock.

11. An apparatus that ascertains a representative measurement that is indicative of a relative oscillation speed of a reference clock during a representative calibration period, wherein the reference clock generates a reference clock signal, and wherein a known number of cycles of a signal generated by a non-reference clock span the representative calibration period, the apparatus comprising:
logic configured to define a plurality of calibration periods including a first calibration period and a second calibration period;
logic configured to:
cause the first calibration period to begin at a first start time, wherein a first time offset value is equal to a difference between the first start time and a transition point of the reference clock signal within the first calibration period; and
cause the second calibration period to begin at a second start time, wherein a second time offset value is equal to a difference between the second start time and a transition point of the reference clock signal within the second calibration period, and wherein the first time offset value is different from the second time offset value;
logic configured to generate a plurality of measurements by, for each one of the plurality of calibration periods, ascertaining a characteristic that is indicative of the relative oscillation speed of the reference clock during said one of the plurality of calibration periods;
logic configured to use the plurality of measurements to ascertain an average measurement value; and
logic configured to use the average measurement value as the representative measurement that is indicative of the relative oscillation speed of the reference clock during the representative calibration period.

12. The apparatus of claim 11, wherein the characteristic that is indicative of the relative oscillation speed of the reference clock during said one of the plurality of calibration periods is a numeric value representing a number of cycles of the reference clock that occur during said one of the plurality of calibration periods.

13. The apparatus of claim 11, wherein the characteristic that is indicative of the relative oscillation speed of the reference clock during said one of the plurality of calibration periods is a numeric value representing a frequency of the reference clock signal during said one of the plurality of calibration periods.

14. The apparatus of claim 11, wherein the characteristic that is indicative of the relative oscillation speed of the reference clock during said one of the plurality of calibration periods is a numeric value representing a period of the reference clock signal during said one of the plurality of calibration periods.

15. The apparatus of claim 11, wherein the plurality of calibration periods are concatenated with one another.

16. The apparatus of claim 15, wherein the logic configured to generate the plurality of measurements comprises only one counter that is used during each of the calibration periods.

17. The apparatus of claim 11, wherein each of the first and second start times is determined randomly or pseudorandomly.

18. The apparatus of claim 11, wherein the second start time occurs within the first calibration period.

19. The apparatus of claim 18, wherein:
the logic configured to generate the plurality of measurements comprises as many counters as there are calibration periods; and
each of the counters operates only during a corresponding one of the plurality of calibration periods.

20. The apparatus of claim 18, wherein:
the first start time is coincident with one transition point of the signal generated by the non-reference clock;
the second start time is coincident with a different transition point of the signal generated by the non-reference clock; and
the one transition point and the different transition point of the signal generated by the non-reference clock are not coincident with one another.

21. The apparatus of claim 11, wherein the apparatus is an element within a mobile device and each of the first and second start times occurs during a wake-up period of the mobile device.

22. The apparatus of claim 11, comprising:
logic that uses the representative measurement that is indicative of the relative oscillation speed of the reference clock during the representative calibration period to calibrate the non-reference clock.

23. An apparatus for ascertaining a measured number of cycles of a reference clock signal that occur during a representative calibration period, wherein a known number of cycles of a non-reference clock signal generated by a non-reference clock span the representative calibration period, the apparatus comprising:
timing control logic that receives the non-reference clock signal and generates therefrom a plurality of counter enable signals, including a first counter enable signal and a second counter enable signal, wherein each counter enable signal is asserted for a duration equal to a duration of the representative calibration period;

a plurality of counters, each having an enable input connected to receive a respective one of the plurality of counter enable signals, and each having a clock input node connected to receive the reference clock signal, wherein each of the counters maintains a count value that is adjusted in response to an occurrence of a transition point of the reference clock signal only if the respective one of the plurality of counter enable signals is asserted; and logic that receives the count values from the plurality of counters and generates therefrom a mean value, wherein:

the timing control logic causes the first counter enable signal to be asserted at a first start time, wherein a first time offset value is equal to a difference between the first start time and a first transition point of the reference clock signal;

the timing control logic causes the second counter enable signal to be asserted at a second start time, wherein a second time offset value is equal to a difference between the second start time and a second transition point of the reference clock signal; and the first time offset value is different from the second time offset value.

24. The apparatus claim 23, wherein:

the timing control logic causes the first counter enable signal to be deasserted at a first stop time;

the timing control logic causes the second counter enable signal to be deasserted at a second stop time; and the first stop time is coincident with the second start time.

25. The apparatus of claim 23, wherein each of the first and second start times is determined randomly or pseudo-randomly.

26. The apparatus of claim 23, wherein the second start time occurs after the first start time and before the first stop time.

27. The apparatus of claim 26, wherein:

the first start time is coincident with one transition point of the signal generated by the non-reference clock;

the second start time is coincident with a different transition point of the signal generated by the non-reference clock; and the one transition point and the different transition point of the signal generated by the non-reference clock are not coincident with one another.

* * * * *